United States Patent [19]
Daszkowski

[11] Patent Number: 4,654,754
[45] Date of Patent: Mar. 31, 1987

[54] THERMAL LINK

[75] Inventor: Joseph M. Daszkowski, New Hyde Park, N.Y.

[73] Assignee: Fairchild Weston Systems, Inc., Syosset, N.Y.

[21] Appl. No.: 438,560

[22] Filed: Nov. 2, 1982

[51] Int. Cl.$^4$ ............................................. H05K 7/20
[52] U.S. Cl. ................................... 361/388; 165/185; 174/16 HS; 357/81; 361/386
[58] Field of Search .................. 174/16 HS; 361/386, 361/389, 387, 388; 357/81, 79; 165/185, 80 B; 339/112 R; 200/85 R, 86 R

[56] References Cited

U.S. PATENT DOCUMENTS

| | | | |
|---|---|---|---|
| 2,328,488 | 8/1943 | Peters | 165/80 B |
| 3,005,036 | 10/1961 | Mowatt | 339/112 R |
| 3,195,084 | 7/1965 | Book | 165/185 |
| 3,264,534 | 8/1966 | Murphy | 174/16 HS |
| 3,694,182 | 9/1972 | Aktirat et al. | 165/185 |
| 3,883,834 | 5/1975 | Osteen | 174/16 HS |
| 3,920,940 | 11/1975 | Brown et al. | 200/86 R |
| 3,950,057 | 4/1976 | Calabro | 339/65 |
| 4,008,487 | 2/1977 | Vogt | 357/81 |
| 4,029,999 | 6/1977 | Neumann et al. | 361/386 |
| 4,151,547 | 4/1979 | Rhoades et al. | 165/185 |
| 4,172,216 | 10/1979 | O'Shea | 200/86 R |
| 4,394,530 | 7/1983 | Kaufman | 174/16 HS |

OTHER PUBLICATIONS

IBM Technical Disclosure Bulletin, vol. 15, No. 6, Nov. 1972, p. 1950.
U.S. Department of Defense, Thermal Application Handbook for Standard Electronic Modules Program TP529, Mar. 1981, pp. 6-26 thru 6-40.
Instrument Specialties Co. Inc., Precision Springs Catalog 15-B, 1981, pp. 8, 10, 11-15 plus insert ISC-307.
Tecknit EMI Shielding Products Catalog, 1980, pp. B-1, B-4, C-2, D-1 thru D-3, D-860, G-5.
Chomerics Standard EMI/RFI Conductive Elastomer Gaskets Catalog, 1980, pp. 4-7, 10, 11, 27.
Chomerics Laminates Cho-Therm 1674 Brochure, 1981.

*Primary Examiner*—A. D. Pellinen
*Assistant Examiner*—Gregory D. Thompson
*Attorney, Agent, or Firm*—Stephen A. Becker; Benjamin J. Hauptman; Dale Gaudier

[57] ABSTRACT

A thermal link provides a thermal path between a heat source and a heat sink which compensates for irregularities on the surface of the heat source and/or heat sink and/or nonuniformity in the spacing therebetween. One embodiment utilizes a spring metal device having a free arm which allows the link to align itself under low pressure so that it is in intimate contact with both the heat source and heat sink. Another embodiment utilizes an elastomeric material filled with thermally conducting particles to form a mat that has a plurality of raised sections having air spaces between each of the sections. The raised areas deform under low pressure by expanding laterally into the air spaces to conform to the space between the heat source and the heat sink.

8 Claims, 17 Drawing Figures

THERMAL LINK

BACKGROUND OF THE INVENTION

This invention relates to a thermal link which is placed between a source of heat and a heat sink when the source of heat cannot be cooled directly. One common example of the use of a thermal link is to carry the heat produced by a semiconductor device or a circuit board containing many semiconductor devices to an external heat sink when cooling these devices directly by placing them in a fluid flow is undesirable or impossible.

As is well known in the art, air is a poor conductor of heat. Therefore, it is necessary that the thermal link make a good contact with both the heat source and heat sink so as to exclude or minimize the amount of air trapped therebetween. The use of fillers, such as thermally conductive grease, between the heat source or heat sink and the thermal link is undesirable because such materials tend to attract and hold dirt which may then interfere with the efficient transfer of heat. In addition, these greases are subject to drying up with age or running at high temperatures, which creates maintenance problems and limits its useful life as an efficient heat transfer system. Permanently attaching the thermal link to both the heat source and the heat sink would overcome these problems but is undesirable because it makes the apparatus very difficult to maintain.

These problems are further exacerbated when the heat source and/or the heat sink do not have precision machined flat surfaces so that air pockets can be created at the contact point with the thermal link. The problem can be further complicated if the heat source and the heat sink are so mounted that they are not uniformly spaced from each other, as might be the case, for example, when the mounting configuration is not made from precision made parts.

U.S. Pat. No. 3,950,057 shows a printed circuit card guide which can be utilized to transfer heat from the printed circuit card to an external heat sink. In one embodiment, the printed circuit card is held by a series of arcuate spacers and cantilevered spring fingers which are mounted in a U-channel which in turn is fastened to a frame. In another embodiment the printed circuit card is engaged by means of a strip of flexible metal formed to include opposed, cantilevered flexible spring fingers which in turn are mounted within a U-shaped member. This design does not provide for efficient heat transfer because the heat is transfered from the edges of the printed circuit card, and the printed circuit card engaging means within the guide provide a very small contact area with the card.

It is well known in the art of electromagnetic interference (EMI) shielding to use a strip of finger stock material to bridge the gap between two surfaces. Finger stock material comprises a U-shaped ribbon of spring material having cantilevered spring fingers stamped into one side. The ends of the cantilevered fingers contain arcuate-shaped contacts. The finger stock material is mounted by attaching the side not containing the fingers to a first surface so that the side makes electrical contact with the surface. A second surface touches the surface of the arcuate contacts to make a point-contact electrical connection, thus providing EMI shielding.

The point-contact made by the finger stock does not provide for an efficient thermal transfer between the two surfaces. Flattening the arcuate contacts will not solve this problem because the resulting structure will transmit the forces applied to the fingers to the joining member formed at the base of the U-shaped ribbon, causing it to permanently deform. Once this joining member is permanently deformed, good contact cannot be maintained between the fingers and the surface mating with the fingers, resulting in poor heat transfer.

One solution which readily presents itself is to force together two surfaces which are not in adequate thermal contact by simply using more pressure. In fact, the United States Navy has proposed in the Thermal Application Handbook for the Standard Electronic Modules Program TP 529, dated March 1981 to build a heat sink assembly for a printed circuit card cage in which powerful springs are utilized to force the top fin of the aluminum carrier for the printed cirucit card into contact with an external heat sink. In the particular embodiment disclosed, a net force of 100 pounds per module was utilized to force the surfaces of the printed circuit card carrier and the heat sink into intimate contact. In view of the fact that a large number of modules are normally utilized in such card cages, a large net force is placed upon the heat sink. For example, a card cage containing only 10 modules would have a net force of 1,000 pounds applied to it. This requires a heat sink which is exceptionally rigid, thereby increasing the weight, bulk, and cost of the assembly. In addition, a mechanism is required to apply and release the pressures generated by the springs so that the assembly can be disassembled for maintenance or replacement of individual circuit cards.

It is also known to use thermally conductive particle filled elastomeric materials as thermal links. These devices typically take the form of electrical insulators for semiconductor devices which replace the conventional mica insulator covered with heat conducting grease. These insulators take the form of a thin film which is cut to fit the mounting of the semiconductor device and held in place by the mounting hardware for the semiconductor device. These materials have a high durometer and thus require high pressure in order to conform to irregularities in either the heat source or heat sink or to compensate for nonuniform spacing in the mounting of the heat source and the heat sink relative to each other. This does not pose a problem where these materials are utilized to mount, for example, a single transistor by means of screws. However, if a large number of devices or modules are linked to a single heat sink, the force applied to the heat sink can be excessive, creating the weight, bulk and cost problems described above.

SUMMARY OF THE INVENTION

It is a general object of the present invention to provide an improved thermal link for conducting heat from a heat source to heat sink.

This and other objects, advantages and features are achieved by a thermal link for use between a heat source and a heat sink which may have irregular surfaces or be nonuniformly spaced relative to each other. The thermal link is formed of a material having a high thermal conductivity and has heat transfer surfaces adapted for mating with corresponding surfaces of the source or the sink. The thermal link is shaped to be deformable under relatively light pressure to conform to the space between the source and the sink.

DETAILED DESCRIPTION

Figure 1A:
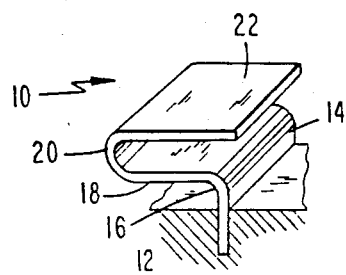
FIG. 1A is a perspective view of one embodiment of a thermal link made in accordance with the invention.

Referring to FIG. 1A, a thermal link 10 in accordance with the present invention is connected to either the heat source or the heat sink, generally referred to as 12. The thermal link may be mounted into a slot formed or cut into the heat source or heat sink as shown, or a U-channel device either molded into the heat source or heat sink or attached thereto as a separate element (not shown) may be utilized. The first segment 14 of the thermal link is attached to the channel formed in the heat source or heat sink by any suitable technique which will allow thermal conduction between the heat source or heat sink and the thermal link, such as by soldering. The thermal link contains a second segment 18 which is attached to the end of the first segment 14 remote from the heat source or heat sink by means of a joining member 16. A third segment 22 of the thermal link is attached to the second segment 18 at the end thereof remote from the first joining member by means of a second joining member 20.

The surface of the heat source or heat sink which abuts against the third segment 22 of the thermal link 10 may have surface irregularities or have a nonuniform spacing from the heat source or heat sink to which the first segment is mounted over the length or width of the thermal link. The existence of the joining members 16 and 20 on either side of the second segment 18 enables segment 18 to operate as a free arm.

In use, pressure exerted on the third segment 22 by the heat source or heat sink causes the free arm 18 to deform in the planes both transverse and perpendicular to the plane of the paper shown in FIG. 1A, if necessary, so that the third segment and the surface of the heat source or heat sink are in intimate contact. This intimate contact eliminates or reduces air spaces between the third segment and the surface of the heat source or heat sink and permits efficient heat transfer through the thermal link from the heat source to the heat sink. In addition, the large surface contact between the heat source or heat sink and thermal link provides for a low thermal resistance. The utilization of the free arm 18 avoids the problem of permanent deformation of the joining member that would occur if the free arm 18 were fixedly mounted. In addition, the free arm 18 permits the compensation for nonuniformities in the spacing between the heat source and heat sink and/or irregularities of the heat source or heat sink in both the directions transverse to and perpendicular to the plane of the drawing. If the arm 18 were fixedly mounted, then compensation only in the direction transverse to the plane of the drawing could be accomplished. The principle of the present invention is further described hereinafter in connection with the embodiment shown in FIG. 2B as illustrated by FIGS. 3A-3D.

Figure 1B:
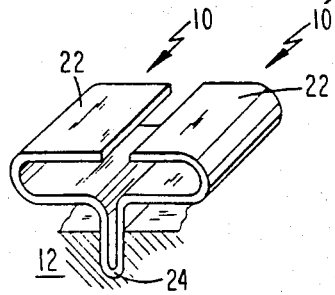
FIG. 1B is a perspective view of another embodiment of a thermal link made in accordance with the invention.

In order to accommodate the surface of a heat source or heat sink having a long dimension perpendicular to the plane of the drawing shown in FIG. 1A, a number of thermal links 10 can be placed in a row in the direction perpendicular to the plane of the drawing. In such an embodiment, each of the thermal links 10 can deform independent of the other, thus providing for improved contact with an irregular surface of a heat source or heat sink. FIG. 1B shows another modification of the heat source shown in FIG. 1A in which two heat sources or heat sinks can be accommodated by a single thermal link. In the embodiment shown in FIG. 1B, the thermal link which is shown in FIG. 1A is mated with the mirror image of that link such that the edges of the first segment 14 remote from the joining member 16 are joined at a common point 24 and the open loops formed by the segments 18 and 22 connected by the joining members 20 face each other. This configuration can be produced by bending a single strip of material into the desired shape and mounting it into a single channel in the heat source or heat sink to provide a thermal link between two heat sources and a common heat sink, for example.

Figure 2A:
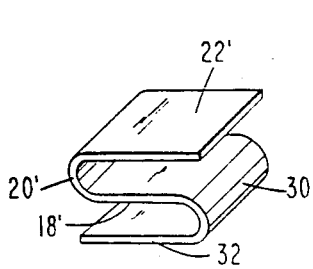
FIG. 2A shows a perspective view of still another embodiment of the invention.

FIG. 2A illustrates an alternate embodiment of the invention shown in FIG. 1A. The primed reference numerals in FIG. 2A correspond to the unprimed reference numerals in FIG. 1A. In the embodiment of the FIG. 2A, a fourth segment 32 is connected to the end of the first segment 14 remote from the joining member 16 to form an "S" shaped device. The third segment 22' and the fourth segment 32 are of similar but not necessarily identical shape. The element 30 may comprise the joining member 16, the first segment 14 and another joining member between the first segment and the fourth segment 32. Alternatively, the element 30 can comprise a joining member coupled between the elements 18' and 32 similar to the coupling of joining member 20' between the elements 18' and 22'. This embodiment has the advantage of providing a large surface contact area on both the heat source and the heat sink thus obviating the need for the channel shown in the embodiment of FIGS. 1A and 1B. In addition, this embodiment can be utilized without being attached to either the heat source or the heat sink because the pressure utilized to deform the thermal link can be utilized to maintain the thermal link in position between the heat source and the heat sink.

Figure 2B:
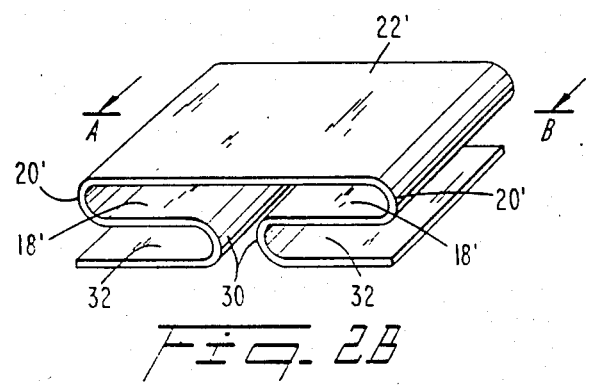
FIG. 2B shows a perspective view of yet another embodiment of the invention.

FIG. 2B shows a modified form of this embodiment in which a thermal link shown in FIG. 2A is connected to the mirror image of that thermal link by sharing a common third segment 22'. The open loops formed by segments 18' and 22' and joining members 20' face each other while the open loops formed by elements 18', 30 and 32 face away from each other. This shape provides the advantage of providing improved compensation for irregularities or nonuniform spacing over a full 360° range. The operation of this form of the invention is further explained below in connection with FIGS. 3A–3D.

Figure 3A:
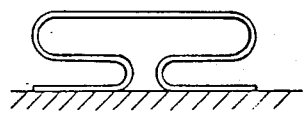
FIGS. 3A-3D show a cross sectional view of the thermal link along line A-B in FIG. 2B in its free state and when subjected to evenly and unevenly applied pressures.
Figure 3B:
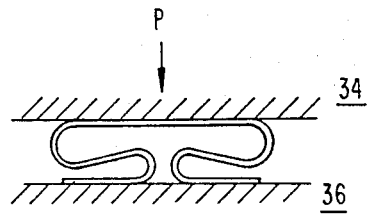
Figure 3C:
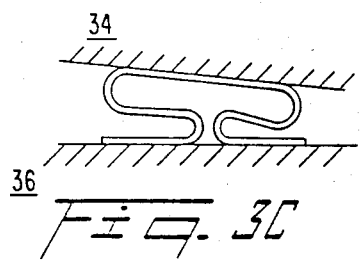
Figure 3D:
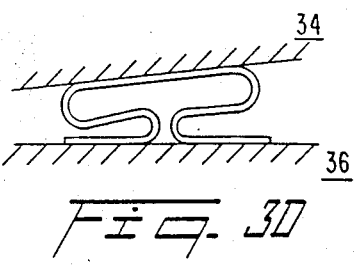

FIG. 3A shows a cross section of the embodiment of FIG. 2B taken along line A–B in its free state, that is, without any pressure applied to deform the link. FIG. 3B shows the same thermal link with an even pressure applied between a heat source 34 and a heat sink 36. It should be understood that the positions of the heat source 34 and heat sink 36 could be interchanged in the figure. As illustrated, the heat source 34 and the heat sink 36 are uniformly spaced, that is, substantially parallel. FIGS. 3C and 3D show a mounting arrangement in which the heat source 34 and heat sink 36 are not parallel so that the space between them is not uniform. In accordance with the principles of the present invention, as illustrated by this example utilizing only one embodiment, the thermal link will align itself so that the segments in contact with both the heat source and heat sink are always in intimate contact. It should be noted that the surfaces 22 of FIG. 1B or 32 of FIG. 2B can conform independently to different spacing between the heat source and the heat sink. Although this principle is illustrated only for the embodiment shown in FIG. 2B, because it is believed that this provides a clearer illustration of the principle, it should be understood that this principle applies equally as well to the embodiments shown in FIGS. 1A, 1B and 2A.

The embodiment shown in FIGS. 2A and 2B can also be utilized in a multisegmented form as discussed for the embodiments of FIGS. 1A and 1B. Advantageously, the thermal links shown in FIGS. 1A, 1B, 2A and 2B can be formed from a single piece of material. Metals have the advantage of providing high conductivity at low cost and are available in strip form which can easily be bent into the desired shape. Although many metals or metal alloys such as spring tempered beryllium copper, silver alloys or phosphor bronze could be utilized for a thermal link in accordance with the present invention, it is been found that a tempered copper alloy such as CDA alloy 155 strip manufactured by Hussey/Copper Range Co. is particularly advantageous because it provides a high thermal conductivity at low cost while being easily made galvanically compatible with aluminum, a common material for heat sinks.

Figure 4:
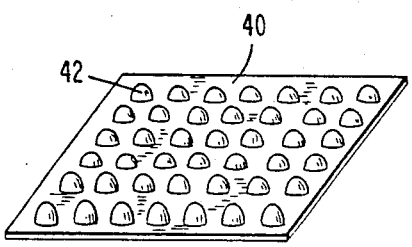
FIG. 4 shows a perspective view of a filled elastomeric thermal link made in accordance with this invention.
Figure 5A:
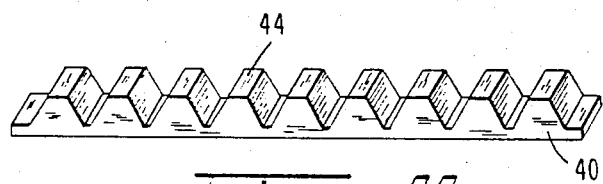
FIGS. 5A-5C show alternate embodiments of the structure shown in FIG. 4.
Figure 5B:
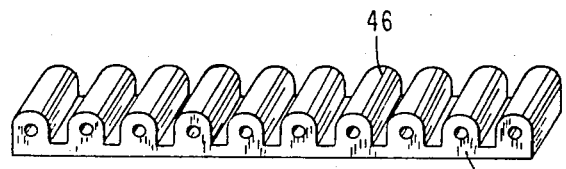
Figure 5C:
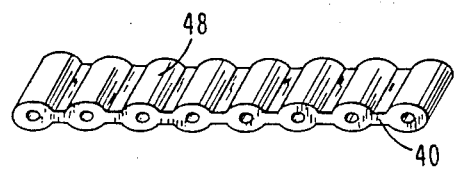
Figure 6A:
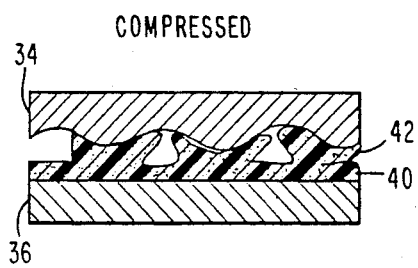
FIGS. 6a, 6b and 6c, 6d show cross-sectional views of the thermal link of FIG. 4 when in compressed and uncompressed states between irregular surfaces and non-parallel surfaces, respectively.
Figure 6C:
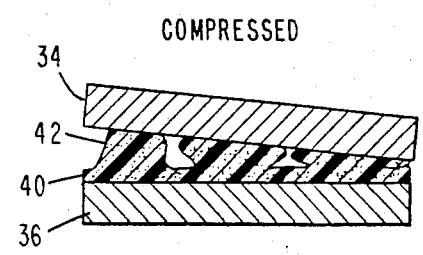
Figure 6B:
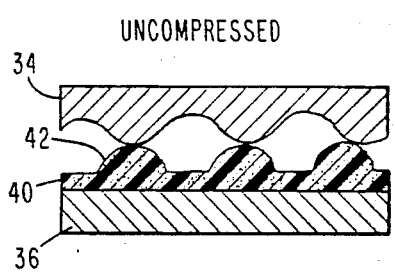
Figure 6D:
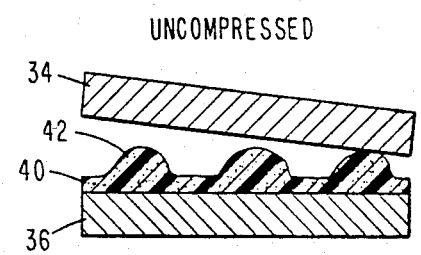

FIG. 4 illustrates an alternate form of the present invention in which an elastomeric material is filled with thermally conducting particles to form a mat or sheet 40 with a plurality of raised sections 42 having an air space between each of the sections. FIG. 6b shows mat 40 in an uncompressed state and disposed between a heat source 34 having an irregular surface and a heat sink 36. FIG. 6d shows mat 40 in an uncompressed state disposed between a heat source 34 and a heat sink 36 which are not parallel to each other. As shown in FIGS. 6a and 6c, when placed between a heat source and a heat sink, and pressure is applied to deform the raised sections, the raised sections expand laterally into the air spaces between each of the raised sections. This lateral expansion allows numerous advantages over prior art single sheet thermal links. Firstly, the plurality of raised sections each deforming independent of the other permits the thermal link to accommodate irregularities in the surfaces of the heat sink or the heat source (see FIG. 6a) as well as accommodating nonuniformity in the spacing between the heat sink and the heat source (see FIG. 6c). In addition, by allowing the elastomeric material to expand in a direction generally parallel to the heat sink and heat source, each of these raised sections can be made to deform under relatively light pressure so that the excess pressures utilized in prior art approaches can be avoided. This lateral spreading of the raised sections also increases the contact area at the interface between the heat source or heat sink, thus increasing the efficiency of the heat transfer. Furthermore, as the raised sections expanded they thin out reducing the length of the thermal path further reducing the thermal resistance.

The raised surfaces 42 shown in FIG. 4 are of a generally hemispheric shape. However, many other shapes having the required characteristics can be utilized, as illustrated by the rectangular shapes of FIG. 5A, the modified cylindrical or elongated strip shape of FIG. 5B or the tubular shape of FIG. 5C. The shapes shown in FIGS. 4 and 5A–5C are meant to be illustrative only and not limiting the scope of the present invention.

Figure 7:
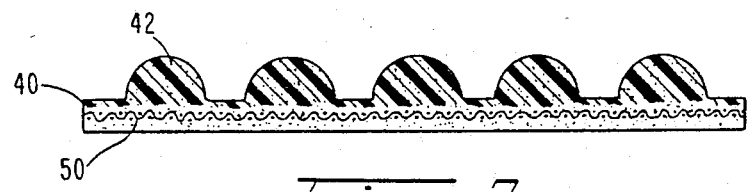
FIG. 7 is a cross-sectional view showing details of construction of one embodiment of the thermal link of FIG. 4.

The lateral air spaces between each of the raised sections should be such that under maximum compression, each of the raised sections just about touches the other to provide a maximum surface area of contact between the heat source and heat sink. A number of filled elastomeric compounds suitable for use in making the thermal link according to this aspect of the present invention are known, for example, CONSIL-C silver-copper filled silicone elastomer or CONSIL-R pure silver filled silicon elastomer, both trademarks of Tecknit. It should be noted that the portions of the mat 40 that connect the raised portions 42, 44, 46 or 48 may or may not be made of the same elastomeric material. As is shown in FIG. 7 it is possible to utilize a material such as a thin aluminum, copper or silver mesh to join the raised sections together to form the mat. In addition, it is possible to avoid the need for this section at all by attaching the raised sections individually to one or the other of the heat source or heat sink.

While particular embodiments of the present invention have been disclosed herein, it will be obvious to those skilled in that art that certain changes and modifications can be made to them all included within the scope of the present invention. For example, the surfaces of the heat sources and heat sinks and the surfaces of the segments 22, 22' and 32, herein shown as being flat, could be curved. The heat sources or heat sinks could be, for example, the wall of a cylindrical tube and the surfaces of the segments 22, 22' and 32 curved to fit.

All such changes and modifications can be made without departing from the invention as defined by the appended claims.

I claim:

1. A thermal link which thermally connects a heat source and a heat sink, said heat source and heat sink having irregular surfaces or being nonuniformly spaced relative to each other, said thermal link comprising:
   an electrically insulative mat of resiliently deformable material filled with thermally conductive particles, said mat having a plurality of integrally formed, raised sections with an air space therebetween, said air space allowing for lateral expansion of said plurality of raised sections when said elastomeric material is deformed under pressure applied to said thermal link by said heat sink and said heat source to conform to the space between said heat source and said heat sink.

2. The thermal link of claim 1 wherein said raised sections each comprise a hemisphere.

3. The thermal link of claim 1 wherein said raised sections each comprise an elongated strip.

4. The thermal link of claim 1, 2 or 3 wherein said mat beneath said raised sections contains a metal mesh.

5. The thermal link of claim 1 wherein said air space and raised sections are dimensioned so that when said raised sections are fully deformed under pressure applied to said thermal link by said heat sink and said heat source, the lateral expansion of said raised sections substantially fully fills said air space.

6. A thermal link which thermally connects a heat source and a heat sink, said heat source and heat sink having irregular surfaces or being nonuniformly spaced relative to each other, said thermal link comprising:

an electrically insulative mat of resiliently deformable elastomeric material filled with thermally conductive particles, said mat having a plurality of raised sections with an air space therebetween, said air space allowing for lateral expansion of said plurality of raised sections when said elastomeric material is deformed under pressure applied to said thermal link by said heat sink and said heat source to conform to the space between said heat source and said heat sink;

said air space and raised sections being dimensioned so that when said raised sections are fully deformed under pressure applied to said thermal link by said heat sink and said heat source, the lateral expansion of said raised sections substantially fully fills said air space.

7. A thermal link thermally connecting a heat source and heat sink, said heat source and heat sink having irregular surfaces or being nonuniformly spaced relative to each other, said thermal link comprising:

a mat of resiliently deformable elastomeric material filled with thermally conductive particles, said mat having a plurality of raised sections with an air space therebetween, said plurality of raised sections being expanded into said air space when said elastomeric material is deformed under pressure applied to said thermal link by said heat sink and said heat source to conform to the space between said heat source and said heat sink;

said mat beneath said raised sections containing a metal mesh.

8. The thermal link of claim 1, 6, or 7, wherein said raised sections of said elastomeric material are substantially solid.

* * * * *